United States Patent
Shinmori

(10) Patent No.: US 7,058,856 B2
(45) Date of Patent: Jun. 6, 2006

(54) SEMICONDUCTOR CIRCUIT WITH FLASH ROM AND IMPROVED SECURITY FOR THE CONTENTS THEREOF

(75) Inventor: Nobuaki Shinmori, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 485 days.

(21) Appl. No.: 09/905,195

(22) Filed: Jul. 16, 2001

(65) Prior Publication Data
US 2002/0018380 A1 Feb. 14, 2002

(30) Foreign Application Priority Data
Jul. 18, 2000 (JP) .............................. 2000-216983
Dec. 11, 2000 (JP) .............................. 2000-375828

(51) Int. Cl.
*G06F 11/00* (2006.01)
(52) U.S. Cl. ......................................... 714/30; 726/27
(58) Field of Classification Search .................. 714/38, 714/25, 30, 724, 726; 711/703; 713/193, 713/189, 200
See application file for complete search history.

(56) References Cited

U.S. PATENT DOCUMENTS

| | | | |
|---|---|---|---|
| 4,698,750 A * | 10/1987 | Wilkie et al. | 365/185.04 |
| 5,689,516 A * | 11/1997 | Mack et al. | 714/725 |
| 5,737,760 A * | 4/1998 | Grimmer et al. | 711/163 |
| 5,819,025 A * | 10/1998 | Williams | 714/30 |
| 6,145,122 A * | 11/2000 | Miller et al. | 717/129 |
| 6,243,842 B1 * | 6/2001 | Slezak et al. | 714/724 |
| 6,523,099 B1 * | 2/2003 | Namekawa | 711/163 |
| 6,662,314 B1 * | 12/2003 | Iwata et al. | 714/42 |
| 6,711,684 B1 * | 3/2004 | Moroney et al. | 713/191 |
| 6,769,065 B1 * | 7/2004 | Mayer | 713/200 |
| 2005/0039039 A1 * | 2/2005 | Moyer et al. | 713/200 |

\* cited by examiner

*Primary Examiner*—Robert Beausoliel
*Assistant Examiner*—Marc Duncan
(74) *Attorney, Agent, or Firm*—Rabin & Berdo, PC

(57) ABSTRACT

This invention provides a micro controller in which a JTAG (Joint Test Action Group) port becomes available through a specific operation even after a security bit is set. More specifically, an embodiment of this invention provides a micro controller wherein: when an address signal AD2 and data DT2 are input from a JTAG port 11, the address signal AD2 and data DT2 are kept in shift registers 25 and 26 through a TAP (Test Access Port) 24; the address signal AD2 is forwarded to a flash ROM and data DT1 of the address specified by the address signal AD2 is read out and output a comparator 27; the data DT2 is also output the comparator 27; if the data DT1 and DT2 agree, the output signal from the comparator 27 turns "H" and the output signal from an AND gate 23 turns "L" independent of a security signal SEQ; and thereby a JTAG control circuit 12 is switched on and the JTAG port 11 becomes connected to TAPs 13 and 14 through the JTAG control circuit 12.

8 Claims, 8 Drawing Sheets

SEMICONDUCTOR CIRCUIT WITH FLASH ROM AND IMPROVED SECURITY FOR THE CONTENTS THEREOF

BACKGROUND OF THE INVENTION

The present invention relates to a semiconductor circuit.

PRIOR ART

Recently, a micro controller having the function of debugging programs by using JTAG (Joint Test Action Group) and the like has become mainstream. Software developers debug application software by using this function to develop new programs easily.

Also, a micro controller with flash ROM built-in has recently become popular and can execute rewriting the flash ROM by using the JTAG. And a security bit is set in this flash ROM so that the contents of the flash ROM may not be read out by a third party. It is to be noted that the data written in the flash ROM is an application program created by the user of micro controller and that the writer in flash ROM cannot read out and rewrite partially the data by setting the security bit.

However, although the contents of the flash ROM cannot be read out by the flash ROM writer in which the JTAG port is used after setting the security bit to "1", the contents of the flash ROM can be downloaded easily by the debugging function in which the JTAG port is used since a command can be inserted directly into a central processing unit (CPU). Therefore, the security bit of the conventional semiconductor circuit does not adequately protect the security of flash ROM.

SUMMARY OF THE INVENTION

The present invention has been achieved in view of the aforementioned problem possessed by the conventional semiconductor circuit. A first object of the present invention is to provide a novel and improved semiconductor circuit capable of preventing the contents of flash ROM from being read out by the third party.

Further, a second object of the present invention is to provide a novel and improved semiconductor circuit in which a JTAG port becomes available through a specific operation as one of the means to achieve the first object of the present invention even when a debugging function in which the JTAG port is used is not available.

To achieve the above object, according to a first aspect of the present invention, there is provided a semiconductor circuit wherein a JTAG control circuit controlled by the security bit of a flash ROM is equipped between the JTAG port and a TAP (Test Access Port).

According to a second aspect of the present invention, there is provided a semiconductor circuit comprising: an inhibit (INHIBIT) NAND gate; a Pin scramble-circuit decoding a micro controller general-purpose port, which are set between the security bit of a flash ROM and the JTAG control circuit; and a circuit wherein the inverted level of the one of the Pin scramble-circuit output is input the one side of the inhibit NAND gate and the output of the security bit of a flash ROM is input the other side of the inhibit NAND gate.

According to a third aspect of the present invention, there is provided a semiconductor circuit comprising: an inhibit NAND gate; a debug enable (DBG_EN) register as an internal register of the micro controller, which are set between the security bit of a flash ROM and the JTAG control circuit; and a circuit wherein the inverted level of the one of the debug enable register output is input the one side of the inhibit NAND gate and the output of the security bit of a flash ROM is input the other side of the inhibit NAND gate.

According to a fourth aspect of the present invention, there is provided a semiconductor circuit having a security releasing means comparing the data which is input a test port with the data stored in a memory device and turning on a switch when the two data agree, and the semiconductor circuit comprising: a memory device to store control program and data; a central processing unit to execute a specific process according to the program; a test port to input and output test signals; and a switch to control on/off between the test port and the memory device and/or the central processing unit according to the security bit set in a nonvolatile register.

According to a fifth aspect of the present invention, there is provided a semiconductor circuit comprising: a memory device to store control program and data; a central processing unit to execute a specific process according to the program; a test port to input and output test signals; a switch to control on/off between the test port and the central processing unit; and a security releasing means comparing data which is input a test port with data stored in a memory device and turning on a switch when the two data agree.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
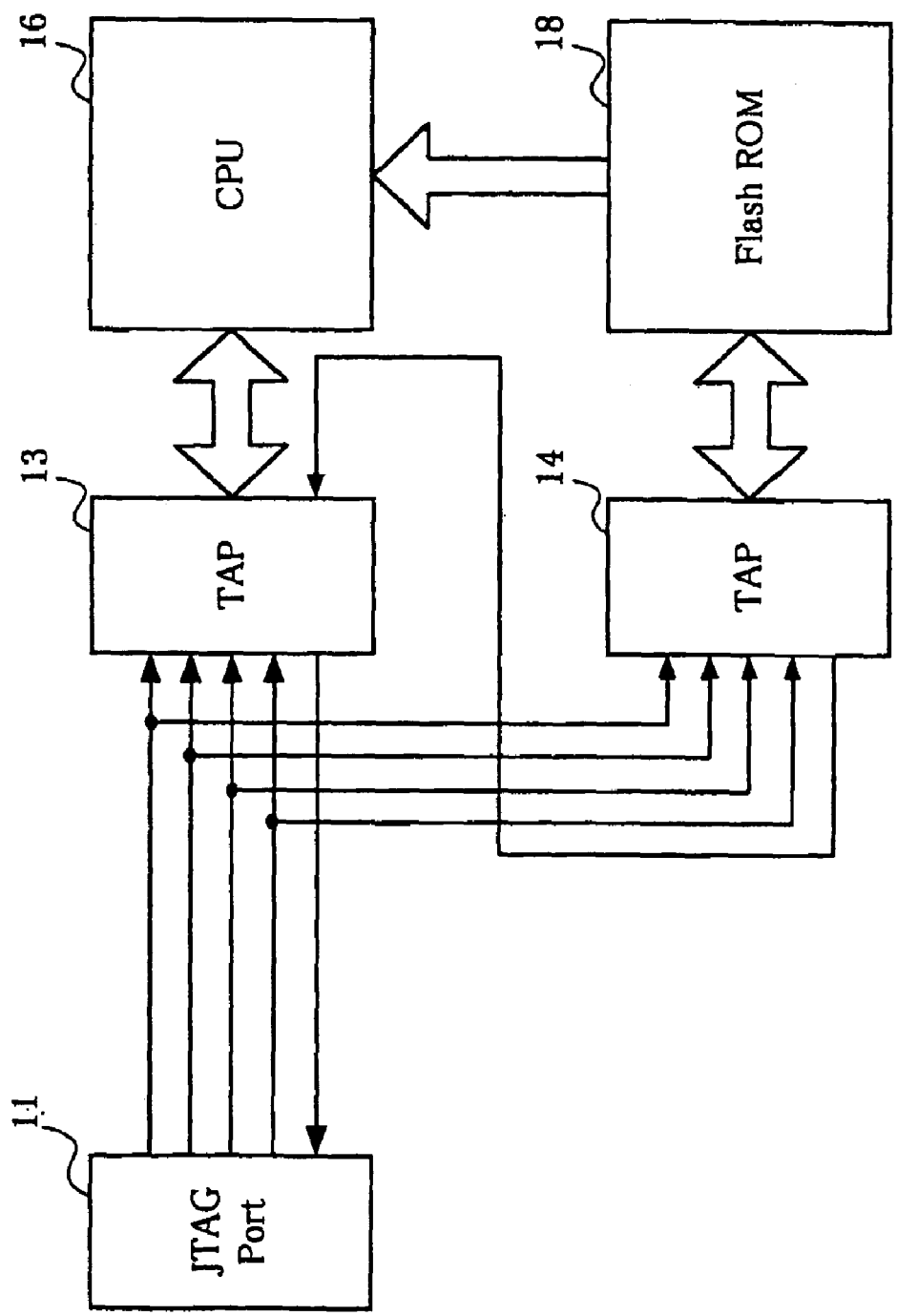
FIG. 1 illustrates a general configuration of JTAG circuit.

Hereinafter, the preferred embodiments of the semiconductor circuit of the present invention will be described in detail with reference to the accompanying drawings. The same reference numerals are attached to components having the same functions in following description and the accompanying drawings and a description thereof is omitted.

FIRST EMBODIMENT

FIG. 1 illustrates the general configuration of a JTAG (Joint Test Action Group) circuit wherein reference number 11 corresponds to a JTAG port; 13 and 14 correspond to TAP (Test Access Port); 16 corresponds to CPU; and 18 corresponds to a flash ROM.

Figure 2:
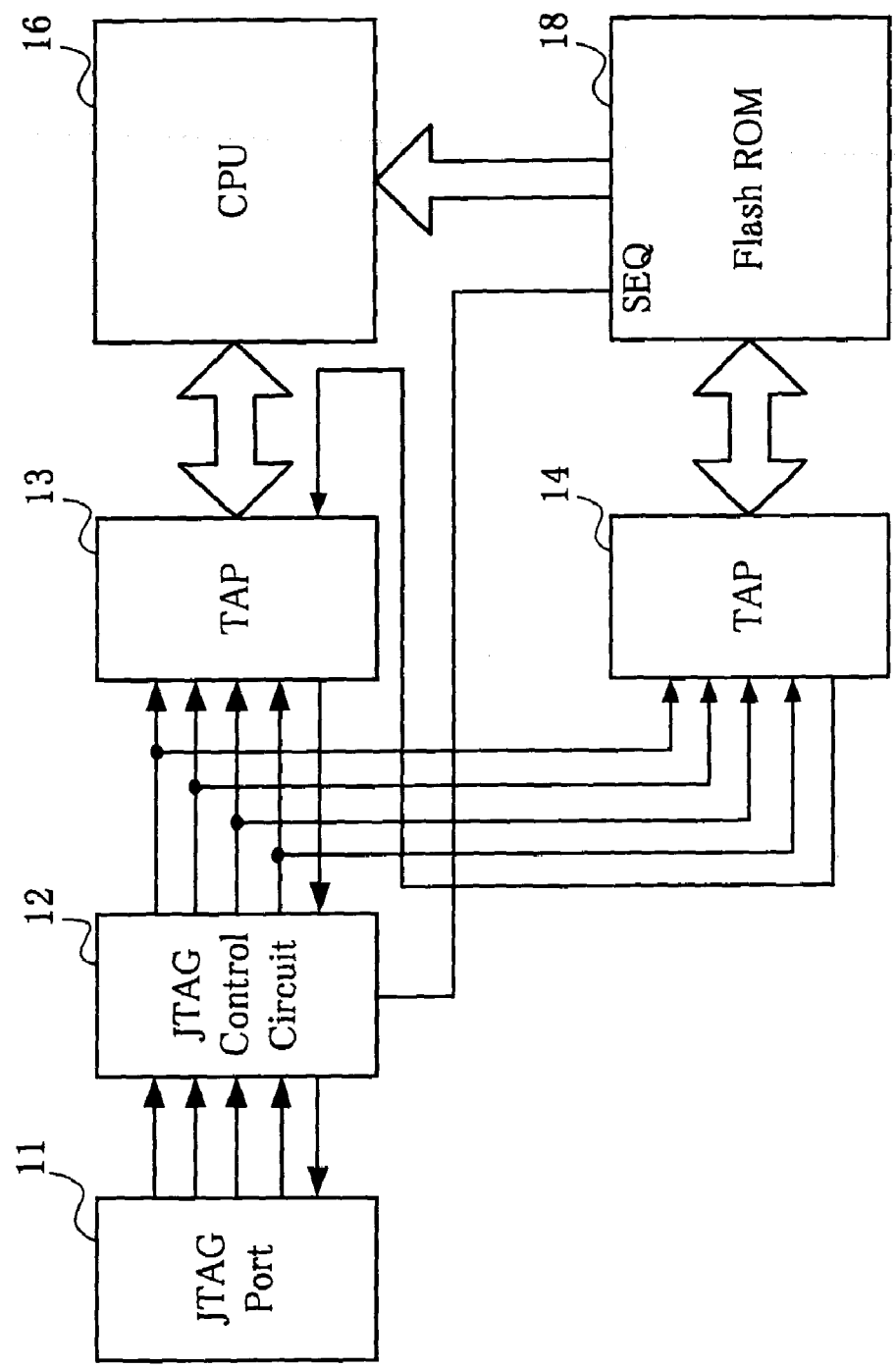
FIG. 2 illustrates the first embodiment of the present invention.

In this embodiment, as shown in FIG. 2, a JTAG control circuit 12 capable of prohibiting or allowing communication of signals is installed between the JTAG port 11 and the TAPs 13 and 14, and is controlled by the security bit of the flash ROM 18.

Hereinafter, the explanation is to be provided with regard to the flow of the circuit of the present invention.

A programmer debugs and develops a program by using the JTAG port 11. When the development ends, he writes "1" in the security bit of the flash ROM 18 to input the JTAG control circuit 12 as a prohibit signal and the communication of signals is to be prohibited. As a result, the debugging function in which the JTAG port 11 is used cannot be used. In other words, the circuit is configured so that the security bit written "1" by inserting an OR gate for which an AND gate can be substituted in changing logic makes the TAPs 13 and 14 inputted only "1".

In this embodiment, since the JTAG port 11 is used not only for reading out by a flash ROM writer but also for the debugging function and since the JTAG port 11 is made unavailable by writing "1" in the security bit of the flash ROM 18, the contents of the flash ROM 18 cannot be read out by a third party at all.

However, in some cases, after the program written in the flash ROM has been shipped as a product, a bug in the program is detected and contents of fixed data have to be changed due to the change of program specification. In this case according to the first embodiment, since the JTAG port 11 is not available, the semiconductor circuit has to be scrapped or in some cases the device itself including the semiconductor circuit has to be scrapped.

From second to seventh embodiments which are to be described later, there is provided a semiconductor circuit in which the JTAG port 11 becomes available through a specific operation.

SECOND EMBODIMENT

Figure 3:
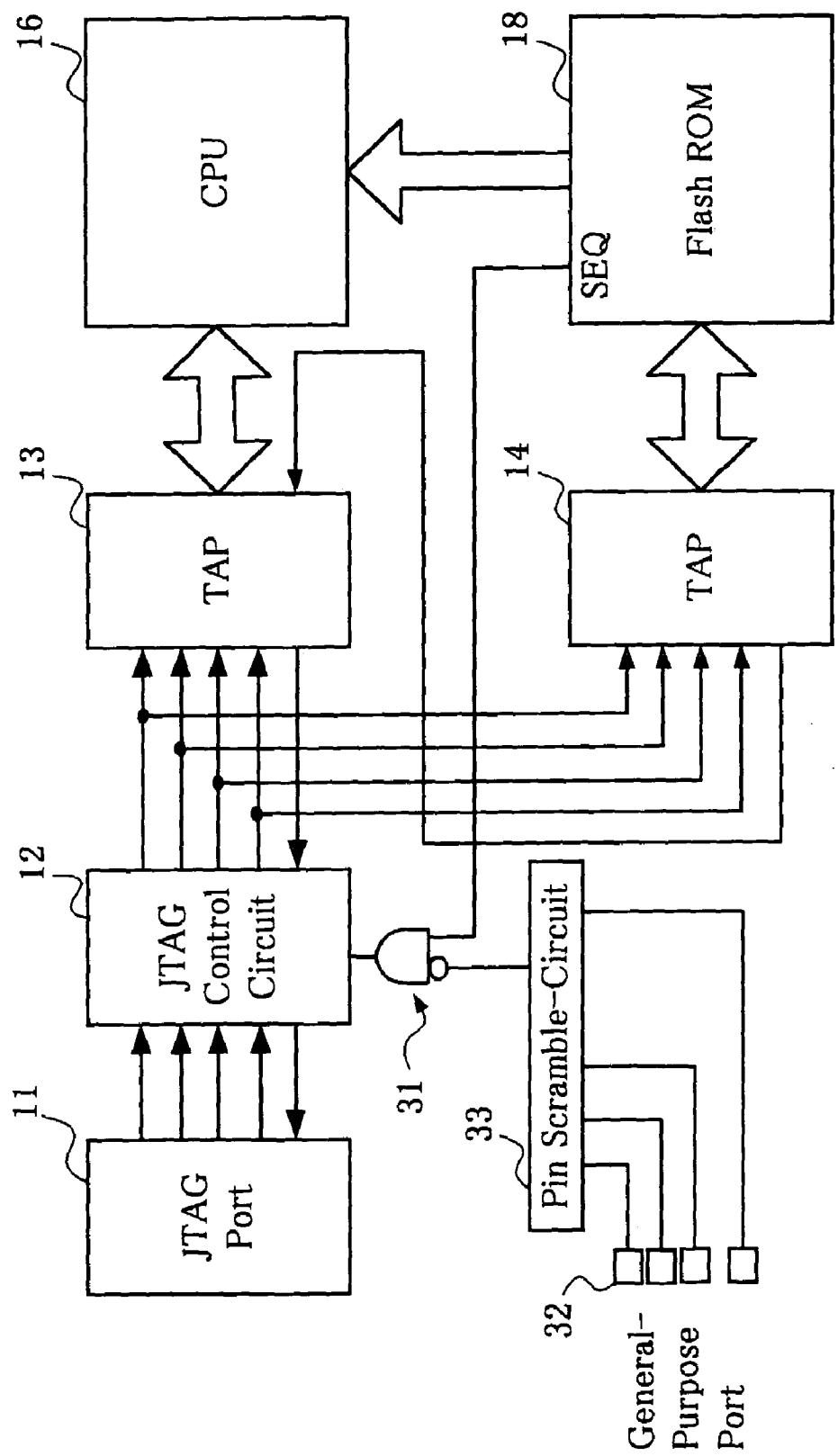
FIG. 3 illustrates the second embodiment of the present invention.

FIG. 3 illustrates a configuration of semiconductor circuit showing second embodiment of the present invention. It is to be noted that the explanation is to be omitted by attaching same numerals as those of FIG. 2 to the parts corresponding to those of FIG. 2.

In this embodiment, the semiconductor circuit comprises: an inhibit NAND gate 31 and a Pin scramble-circuit 33 decoding a general-purpose port 32 of the semiconductor circuit, which are set between the flash ROM 18 and the JTAG control port of the JTAG control circuit 12. It is to be noted that the Pin scramble-circuit 33 decodes one or more inputs from the general-purpose port 32 to input the inhibit NAND gate 31. The contents of Pin scramble-circuit 33 can be set on each chip by a mask option and the like.

Hereinafter, the explanation is to be provided with regard to the flow of the circuit of the present invention.

Similar to the first embodiment, when the debugging ends, a programmer writes "1" in the security bit of the flash ROM 18 to prohibit third party from reading out the contents of flash ROM 18 by the debugging function in which the JTAG port 11 is used. However, the debugging function in which the JTAG port 11 is used can be used by decoding the general-purpose port 32 by the Pin scramble-circuit 33 the contents of which are set.

In this embodiment, since the programmer knowing the contents of Pin scramble-circuit 33 which are set (the contents of the mask option) can debug by using the debugging function in which the JTAG port 11 is used even after writing "1" in the security bit of the flash ROM 18, operation discrepancies and defective products after rewriting in the security bit can be easily detected. Also, since third party who do not know the contents of Pin scramble-circuit 33 (the contents of the mask option) can not use the debugging function in which the JTAG port 11 is used, the contents of flash ROM 18 is to be prevented from leaking out to third party.

THIRD EMBODIMENT

Next, the explanation with regard to third embodiment of the present invention is to be provided.

Figure 4:
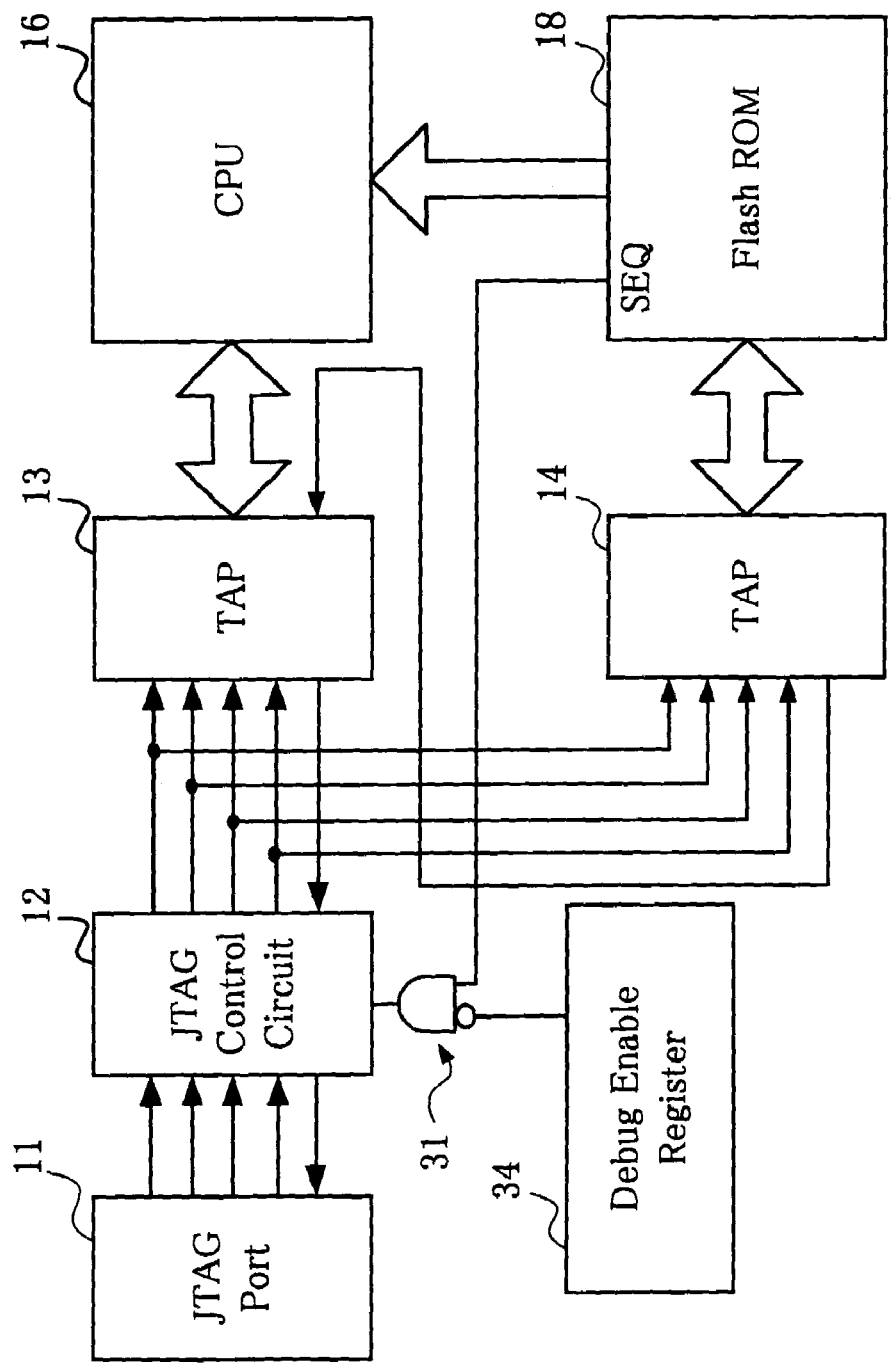
FIG. 4 illustrates the third embodiment of the present invention.

FIG. 4 illustrates a configuration of semiconductor circuit showing third embodiment of the present invention. It is to be noted that the explanation is to be omitted by attaching same numerals as those of FIG. 2 to the parts corresponding to those of FIG. 2.

In this embodiment, a semiconductor circuit comprises a debug enable register 34 as an internal register of the semiconductor circuit which is input one input side of an inhibit NAND gate which is set between the security bit of a flash ROM 18 and the JTAG control circuit 12.

Hereinafter, the explanation is to be provided with regard to the flow of the circuit of the present invention.

Similar to the first and second embodiments, when the debugging ends, a programmer writes "1" in the security bit of the flash ROM 18 to prohibit third party from reading out the contents of flash ROM 18 by the debugging function in which the JTAG port 11 is used. However, preparing a program which sets "1" in the debug enable register 34 on a part of the program created by the programmer and starting up the program according to necessity to set "1" in the debug enables register 34 enable to debug by using the debugging function in which the JTAG port 11 is used.

In this embodiment, similar to the second embodiment, starting up the program to set "1" in the debug enable register 34 enables to debug by using the debugging function in which the JTAG port 11 is used even after writing "1" in the security bit of the flash ROM 18. In addition, the debugging is controlled by program instead of by such specific means as a mask option to save the cost, different from the second embodiment. Starting up the program to set "1" in the debug enable register 34 can be achieved only by a program developer knowing the contents of the program of the flash ROM 18. Consequently, third party who do not know the contents of the program of the flash ROM 18 cannot set "1" in the debug enable register 34.

Therefore, debugging after writing "1" in the security bit of the flash ROM 18 can be easily achieved and third party can be prevented from reading out the contents of the flash ROM 18 by using the debugging function in which the JTAG port 11.

FOURTH EMBODIMENT

Figure 5:
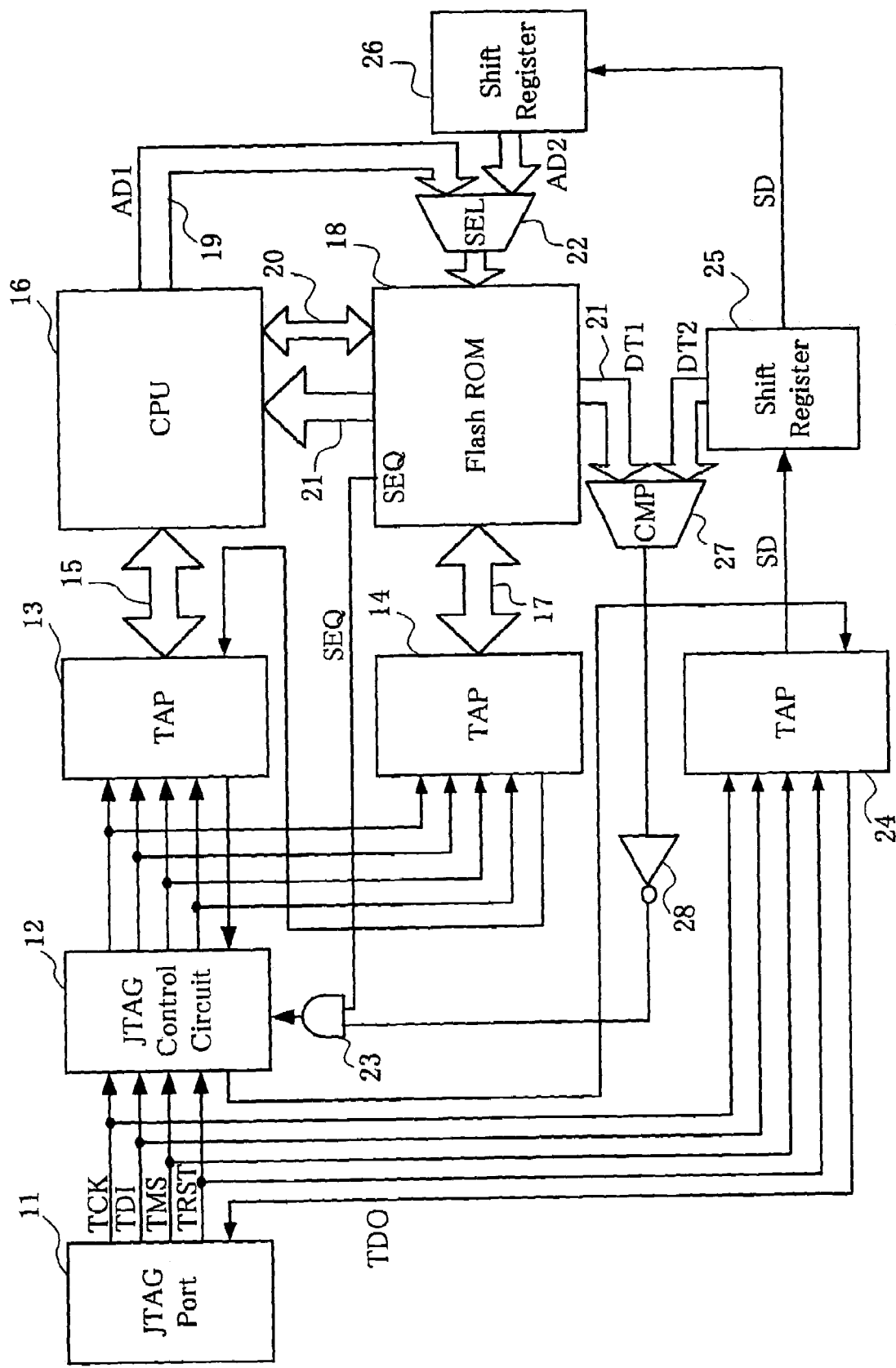
FIG. 5 illustrates the fourth embodiment of the present invention.

FIG. 5 illustrates a configuration of semiconductor circuit showing fourth embodiment of the present invention. It is to be noted that the explanation is to be omitted by attaching same numerals as those of FIG. 2 to the parts corresponding to those of FIG. 2.

This semiconductor circuit comprises a JTAG port 11 which is an interface to connect debugging device and the like in debugging. The JTAG port 11 inputs and outputs such signals as a test clock signal (TCK), test input data (TDI), a test mode selection signal (TMS), a test reset signal (TRST) and test output data (TDO) and serial data.

The JTAG port 11 is connected to TAP 13 and 14 through a JTAG control circuit 12, which turns switch-on in level "L" of a control terminal to connect the JTAG port 11 to the TAP 13 and 14 and turns switch-off in level of the control terminal to disconnect the JTAG port 11 to the TAP 13 and 14.

The TAP 13 is connected to CPU 16 through a control line 15 and the TAP 14 is connected to flash ROM 18 through a control line 17. The TAP 13 decrypts a test signal transmitted from the debugging device through the JTAG port 11 to control the CPU 16 in debugging process and outputs the state and the like of the CPU 16 at the debugging device side. The TAP 14 decrypts a test signal to read and write the data of flash ROM 18.

The CPU 16 and the flash ROM 18 are connected by a control bus 20 and data bus 21. An address signal AD1 which is output from the CPU 16 is transmitted from an address bus 19 to the flash ROM 18 through a selector (SEL) 22. The flash ROM 18 has a rewritable, nonvolatile and independent register called a security bit. The output signal of the register is transmitted to the control terminal of JTAG control circuit 12 through an AND (logical product gate) 23.

Further, the semiconductor circuit comprises TAP 24 directly connected to the JTAG port 11 without using a switch. The TAP 24 outputs serial data SD according to the test clock signal TCK and the test input data TDI which are transmitted from the JTAG port 11 and relays the test output data TDO transmitted from the JTAG control circuit 12 to the JTAG port 11.

The serial data SD is input a shift register 25 for storing data and the series output side of the shift register 25 is connected to a shift register 26. The shift registers 25 and 26 keep the data which is input in series from the shift register 25 to 26 and is output from the shift registers 25 and 26 as a parallel data.

The parallel output side of the shift register 25 is connected to the second input side of a comparator (CMP) 27 and the parallel output side of the shift register 26 is connected to the second input side of selector 22. The first input side of comparator 27 is connected to the CPU 16 by the data bus 21. The comparator 27 compares the data on the first input side with the data on the second input side and outputs a signal "H" when the two data agree. The output side of comparator 27 is connected to the second side of the AND 23 through an inverter 28.

Hereinafter, the explanation is to be provided with regard to the flow of the circuit of the present invention.

In the semiconductor circuit of FIG. 5, the flow of the circuit when the security bit of flash ROM 18 is not set is identical to that of the circuit of FIG. 2. In other words, the security signal SEQ which is output from the flash ROM 18 is "L" and the JTAG control circuit 12 turns switch-on. Consequently, the JTAG port 11 is connected to the TAP 13 and 14 through the JTAG control circuit 12. Also, a control signal (not shown in FIG. 5) selects the first input side of selector 22, through which the address signal AD1 is transmitted from the CPU 16 to the flash ROM 18.

In this configuration, the debugging device is connected to the JTAG port 11, and data and program are written in the flash ROM 18 to check the motion of the CPU 16 and to debug the program in the flash ROM 18. Sequentially, when the debugging has finished, the security bit is set by the command from the debugging device.

When the security bit is set, the security signal SEQ which is output from the flash ROM 18 turns "H". Since the output signal from the comparator 27 is usually "L", the output signal from the AND 23 turns "H" and the JTAG control circuit 12 turns switch-off, hereby the JTAG port 11 is disconnected from the TAP 13 and 14, and the access from the outside of the circuit to the CPU 16 or to the flash ROM 18 through the JTAG port 11 is prohibited to protect the security of the semiconductor circuit. On the other hand, the CPU 16 is connected to the flash ROM 18 by the address bus 19, the control bus 20 and the data bus 21 and carries a specific control process according to the program written in the flash ROM 18.

Hereafter, the explanation is to be provided with regard to debugging to analyze the malfunction of semiconductor circuit and flow to release the security bit, to modify the program and the like in the flash ROM 18.

First, connecting the debugging device to the JTAG port 11 to input the command so that the selector 22 may select the second input side of selector 22, hereby the address bus 19 becomes disconnected from the selector 22 and the parallel output side of shift register 26 becomes connected to the address terminal of flash ROM 18 through the selector 22.

Next, since a debugging person has already known the contents of memory in the flash ROM 18, he forwards a randomly chosen address signal AD2 and data DT2 which corresponds to the address signal AD2 from the debugging device to the JTAG port 11 sequentially. The address signal AD2 and the data DT2 are forwarded to the TAP 24 one after another, from which the address signal AD2 and the data DT2 are output the shift registers 25 and 26 as a series data SD. The shift registers 25 and 26 hereby keep the address signal AD2 and the data DT2 which are input in series from the shift register 25 to 26.

The address signal AD2 kept in the shift register 26 is forwarded to the address terminal of flash ROM 18, and the contents of address signal AD2 in the flash ROM 18, that is, the data DT1 is output through the data bus 21. The address DT2 kept in the shift register 25 is forwarded to the second input side of comparator 27, in which the data DT1 output from the flash ROM 18 and the data DT2 forwarded from the debugging device are compared to each other. Since the data DT1 and DT2 are naturally equal each other, the output signal from the comparator 27 turns "H" and the output signal from the AND 23 turns "L". As a result, the JTAG control circuit 12 turns switch-on.

The JTAG port 11 hereby becomes connected to the TAP 13 and 14 and becomes enabled to access from the debugging device to the CPU 16 and the flash ROM 18. In this state, if the security bit of flash ROM 18 is reset by the debugging device, the security signal SEQ turns "L" and the semiconductor circuit returns to the state to be debugged.

The semiconductor circuit of the present invention as described above comprises: the TAP 24 directly connected to the JTAG port 11; the shift registers 25 and 26 keeping the address signal AD2 and the data AD2 which are forwarded from the TAP 24; and the comparator 27 comparing the data DT1 forwarded from the shift register 26 through flash ROM 18 with the data DT2 forwarded from the shift register 25. Therefore, only the person who knows the contents of memory in the flash ROM 18 can release the security bit.

FIFTH EMBODIMENT

Figure 6:
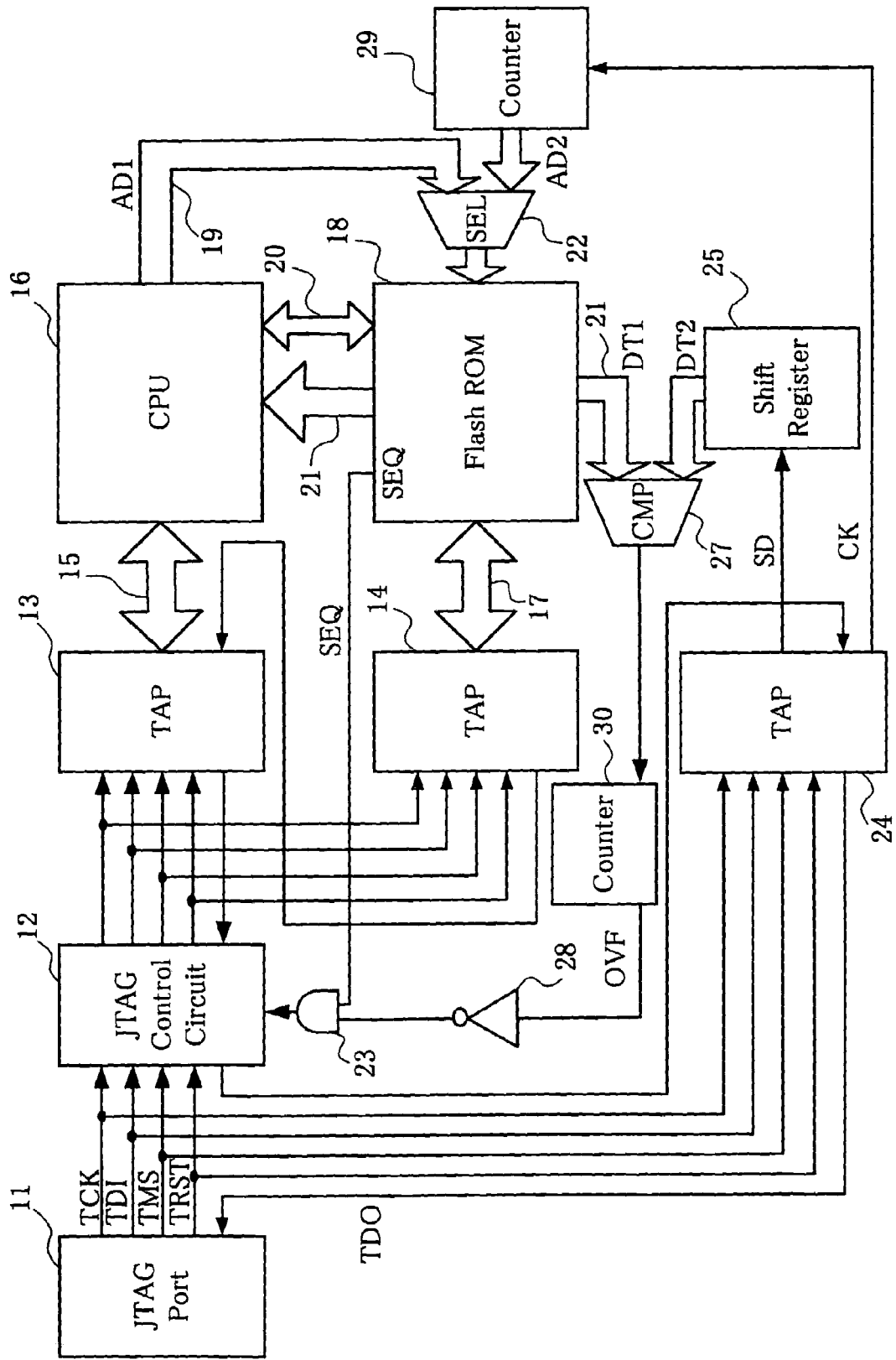
FIG. 6 illustrates the fifth embodiment of the present invention.

FIG. 6 illustrates a configuration of semiconductor circuit showing fifth embodiment of the present invention. It is to be noted that the explanation is to be omitted by attaching same numerals as those of FIG. 5 to the parts corresponding to those of FIG. 5.

In this embodiment, the semiconductor device comprises a counter 29 counting the clock signal CK transmitted from TAP 24 instead of the shift register 26 in FIG. 5 and a counter 30 counting the result of comparison in the comparator 27. The output signal of counter 29 is transmitted as an address signal AD2 to the flash ROM 18 through a selector 22. The counter 30 outputs an overflow signal "H" when the counted number excesses a specific value. The overflow signal OVF is transmitted to the second input side of AND 23 through an inverter 28. The other configurations are identical to those of FIG. 5.

In the semiconductor circuit, the release of the security bit which has been once set is achieved as follows.

First, connecting the debugging device to the JTAG port 11 to input the command to select the second input side of selector 22, hereby the address bus 19 becomes disconnected from the selector 22 and the output side of counter 29 becomes connected to the address terminal of flash ROM 18 through the selector 22 while the command to clear the numbers on counters 29 and 30 is input.

Next, data DT2 with address zero in the flash ROM 18 is forwarded from the debugging device to the JTAG port 11 and kept in a shift register 25, forwarded from the JTAG port 11 through the TAP 24. The data DT2 kept in the shift register 25 is forwarded to the second input side of comparator 27, while the contents of data DT2 with address zero in the flash ROM 18 is read out and forwarded from flash ROM 18 to the first input side of comparator 27 as data DT1 since the number on the counter 29 is zero. Since the data DT1 and DT2 are naturally equal each other, the output signal from the comparator 27 turns "H" and the number on the counter 30 turns "1" from zero.

Sequentially, data DT2 with address one in the flash ROM 18 is forwarded from the debugging device to the JTAG port 11 to increase the number on counter 29 by one with the clock signal CK, hereby the data DT2 forwarded from the debugging device and the data DT1 forwarded from the address 1 in the flash ROM 18 are compared to each other. Since the data DT1 and DT2 are naturally equal each other, the output signal from the comparator 27 turns "H" and the number on the counter 30 turns "2" from "1".

Similarly, if data with all addresses in the flash ROM 18 are input sequentially and all the data agree, the overflow signal OVF is transmitted from the counter 30 to the second input side of AND 23, the output signal from which hereby turns "L". As a result, the JTAG control circuit 12 turns switch-on. The following flow is identical to that of the fourth embodiment.

The semiconductor circuit of the present invention as described above comprises: the TAP 24 directly connected to the JTAG port 11; the shift register 25 keeping the data DT2 forwarded from the TAP 24; the counter 29 counting address signal AD2 sequentially and transmitting to the flash ROM 18; and the counter 30 comparing the data DT1 forwarded from the flash ROM 18 with the data DT2 forwarded from the debugging device and counting the number of agreement of the data DT1 and DT2. Therefore, only the person who knows all the contents of memory in the flash ROM 18 can release the security bit and the stricter security administration can be achieved than that of the fourth embodiment.

SIXTH EMBODIMENT

Figure 7:
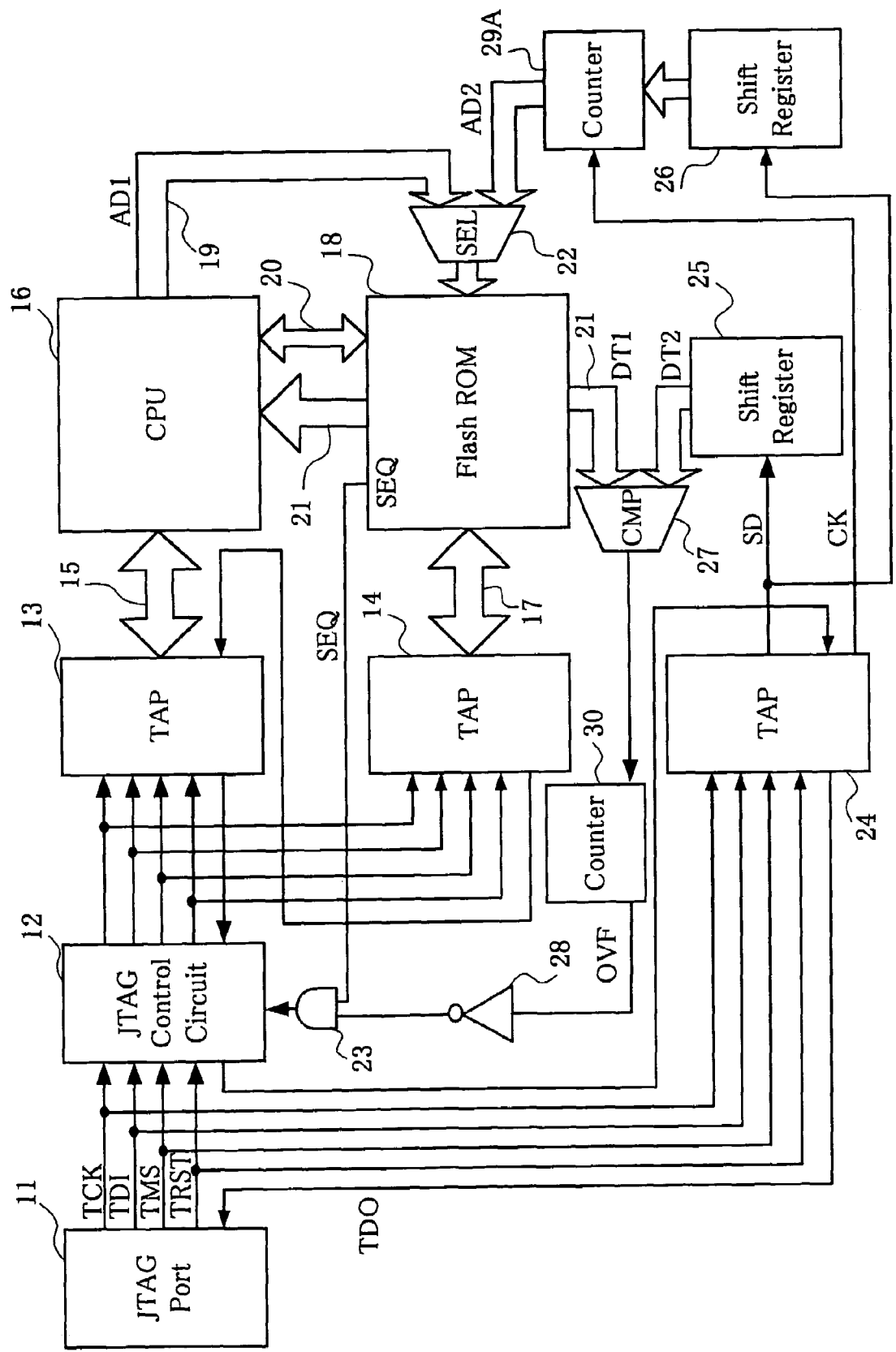
FIG. 7 illustrates the sixth embodiment of the present invention.

FIG. 7 illustrates a configuration of semiconductor circuit showing sixth embodiment of the present invention. It is to be noted that the explanation is to be omitted by attaching same numerals as those of FIG. 6 to the parts corresponding to those of FIG. 6.

In this embodiment, the semiconductor device comprises a counter 29A with initializing function instead of the counter 29 in FIG. 6 and the same shift register 26 as that in FIG. 4 connected to the initial value input side of counter 29A. The other configurations are identical to those of FIG. 5.

In the semiconductor circuit, the release of the security bit which has been once set is achieved as follows.

First, connecting the debugging device to the JTAG port 11 to input the command to select the second input side of selector 22, hereby the output side of counter 29A becomes connected to the address terminal of flash ROM 18 through the selector 22 while the command to clear the number on counter 30 is input.

Next, a randomly chosen address AD2, which is hereon referred to as an address n, and data DT2 with address n in the flash ROM 18 are forwarded from the debugging device to the JTAG port 11 and kept in a shift registers 25 and 26, forwarded from the JTAG port 11 through the TAP 24.

Further, inputting the command to set the contents kept in the shift register 26 as an initial value on the counter 29A, hereby the number on the counter 29A is set n while the contents of data DT2 with address n in the flash ROM 18 is read out and forwarded from flash ROM 18 to the first input side of comparator 27 as data DT1. On the other hand, the data DT2 is forwarded to the second input side of comparator 27. Since the data DT1 and DT2 are naturally equal each other, the output signal from the comparator 27 turns "H" and the number on the counter 30 turns "1" from zero.

Sequentially, data DT2 with address n+1 in the flash ROM 18 is forwarded from the debugging device to the JTAG port 11 to increase the number on counter 29A by one with the clock signal CK, hereby the data DT2 forwarded from the debugging device and the data DT1 forwarded from the address n+1 in the flash ROM 18 are compared to each other. Since the data DT1 and DT2 are naturally equal each other, the number on the counter 30 turns "2" from "1". The following flow is identical to that of the fourth embodiment.

The semiconductor circuit of the present invention as described above comprises: TAP 24 directly connected to JTAG port 11; shift register 25 keeping the data DT2 forwarded from the TAP 24; shift register 26 keeping the data DT2 which is forwarded to flash ROM 18 to be read out as data DT1; counter 29A counting address signal AD2 sequentially and transmitting to flash ROM 18; and counter 30 comparing the data DT1 forwarded from the flash ROM 18 with the data DT2 forwarded from the debugging device and counting the number of agreement of the data DT1 and DT2. Therefore, only the person who knows the contents of memory having the following address after the randomly chosen one in the flash ROM 18 can release the security bit and the stricter security administration can be achieved than that of the fourth embodiment. In addition, since a part of memory data in the flash ROM 18 can be checked, the security bit can be released in a shorter time than that of the fifth embodiment.

SEVENTH EMBODIMENT

Figure 8:
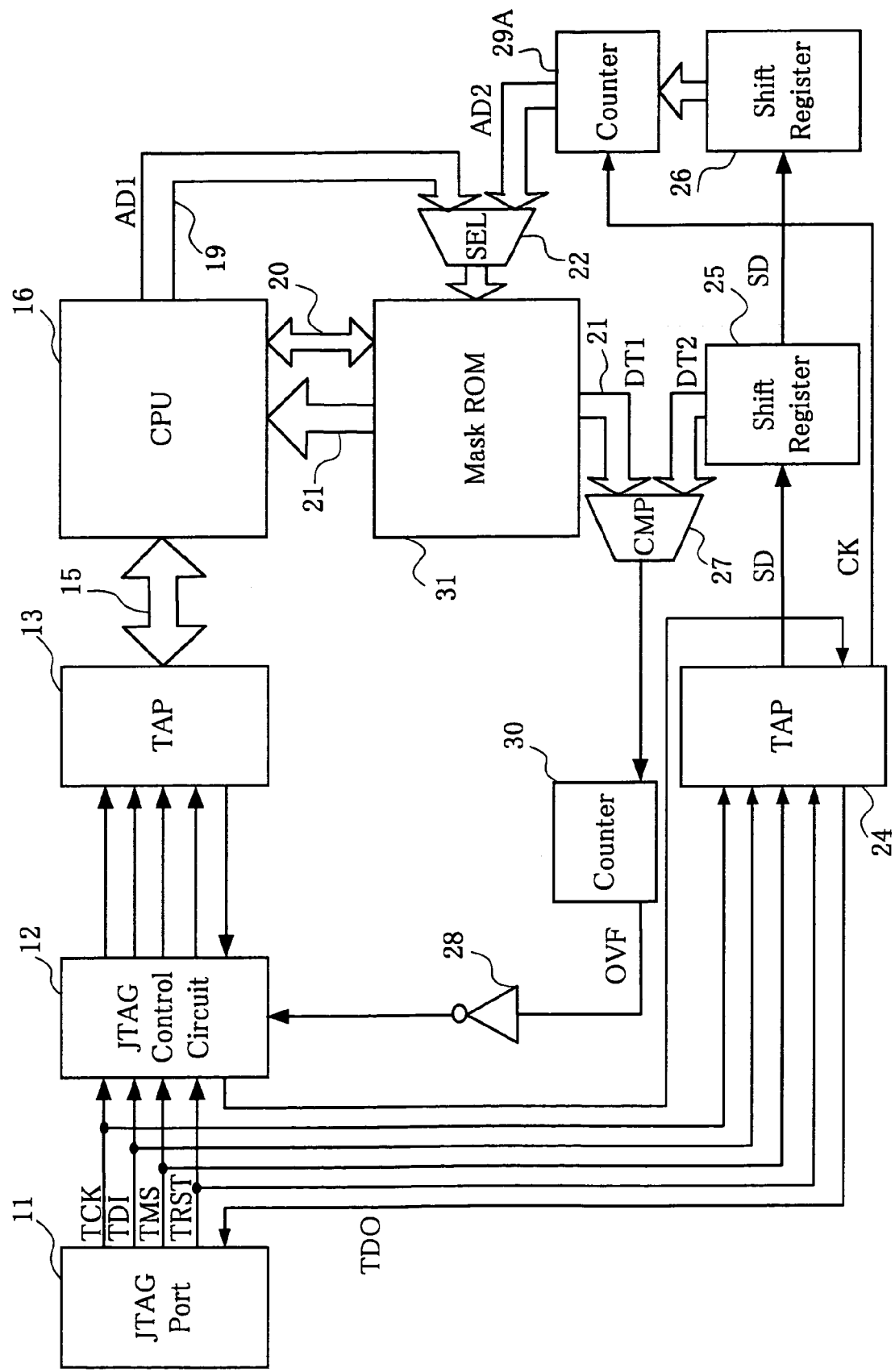
FIG. 8 illustrates the seventh embodiment of the present invention.

FIG. 8 illustrates a configuration of semiconductor circuit showing seventh embodiment of the present invention. It is to be noted that the explanation is to be omitted by attaching same numerals as those of FIG. 7 to the parts corresponding to those of FIG. 7.

In this embodiment, the semiconductor device comprises a mask ROM (read-only memory which cannot be rewritten) 31 instead of the flash ROM 18 in FIG. 7. Consequently, TAP 14 and AND 23 are deleted and the output side of inverter 28 is connected to the control terminal of JTAG control circuit 12. The other configurations are identical to those of FIG. 5.

Preferably, debugging CPU 16 is always prohibited to protect security when the mask ROM 31 is adopted. However, a function which enables to debug the CPU 16 is necessary for a product test as in the fourth–sixth embodiments. In the configuration of this embodiment, the function of TAP 13 corresponding to the one of CPU 16 is set to debug based on the over flow signal OVF transmitted from the counter 30 similar to FIG. 7.

Therefore, the operation to release the security bit in the semiconductor circuit is identical to that in the sixth embodiment and can achieve the effect which is identical to the one in the sixth embodiment.

It is to be noted that the present invention is not restricted to the embodiments as described above and various changes are possible. The examples of changing are:

(a) The input and output signals in the JTAG port 11 can be adopted to any forms of interfaces.

(b) The security signal SEQ and the control signal toward the JTAG control circuit 12 have been explained by using a positive logic, the level of which can be randomly chosen.

In the present invention as explained above, the following effects can be achieved.

(1) Since not only reading out by the flash ROM writer in which the JTAG port is used but also the debugging function in which the JTAG port is used are not become available by writing "1" in the security bit of the flash ROM the contents of the flash ROM cannot be read out by the third party at all.

(2) Since the programmer knowing the contents of Pin scramble-circuit which are set (the contents of the mask option) can debug by using the debugging function in which the JTAG port is used even after writing "1" in the security bit of the flash ROM, operation discrepancies and defective products after rewriting in the security bit can be easily detected. Also, since third party who do not know the contents of Pin scramble-circuit (the contents of the mask option) can not use the debugging function in which the JTAG port is used, the contents of flash ROM is to be prevented from leaking out to third party.

(3) Similar to (2) as described above, starting up the program to set "1" in the debug enable register enables to debug by using the debugging function in which the JTAG port is used even after writing "1" in the security bit of the flash ROM. In addition, the debugging is controlled by program instead of by such specific means as a mask option to save the cost, different from (2) as described above. Starting up the program to set "1" in the debug enable register can be achieved only by a program developer knowing the contents of the program of the flash ROM. Consequently, third party who do not know the contents of the program of the flash ROM cannot set "1" in the debug enable register. Therefore, debugging after writing "1" in the security bit of the flash ROM can be easily achieved and third party can be prevented from reading out the contents of the flash ROM by using the debugging function in which the JTAG port.

(4) The semiconductor circuit comprises a security releasing means turning on a switch when the data which is input a test port agree with the data stored in a memory device. Hereby if the user knows the contents of memory device, he can access the CPU and the memory device through the test port.

(5) The security releasing means comprise an address register keeping the address information input from the test port, a data register keeping the data information input from the test port and a comparator comparing the data read out from the memory device based on the address information with the data kept in the data register. Hereby the security bit can be released only by inputting the address which is chosen randomly and the data corresponding to the address.

(6) The security releasing means comprise an address counter counting the timing information and specifying the memory range, a data register keeping the data information input from the test port and an agreement number counter outputting a releasing signal when the number of agreement of data comes to the specific value. Hereby since the releasing signal is output when specific number of contents of the memory device agree each other, the stricter security administration can be achieved.

(7) The security releasing means comprise an address register setting the initial value based on the address information input from the test port. Hereby inputting the data having following address after the randomly chosen one, the releasing signal is output when the data agree each other. Therefore, the security bit can be released in a short time.

(8) The semiconductor circuit comprises the security releasing means comparing the data input a test port with the data stored in a memory device and turning on a switch when the two data agree. Hereby the person who does not know the contents of memory in the memory device cannot use the test port and the security in CPU can be protected.

What is claimed is:

1. A semiconductor circuit comprising:
   a JTAG (Joint Test Action Group) port;
   a flash ROM that stores a security bit;
   a TAP (Test Access Port) that communicates with the flash ROM; and
   a JTAG control circuit controlled by the security bit of the flash ROM, the JTAG control circuit being connected between the JTAG port and the TAP and allowing or preventing communication of signals between the JTAG port and the TAP depending on the state of the security bit.

2. The semiconductor circuit of claim 1, further comprising:
   an inhibit gate having first and second input terminals, the first input terminal receiving the security bit from the flash memory;
   a micro controller general purpose port; and
   a Pin scramble-circuit decoding the micro controller general-purpose port, the second input terminal of the inhibit gate receiving an output signal from the Pin scramble circuit.

3. The semiconductor circuit of claim 1, further comprising:
   an inhibit gate having first and second input terminals, the first input terminal receiving the security bit from the flash memory; and
   a micro controller that includes a debug enable register as an internal register of the micro controller, the second input terminal of the inhibit gate receiving an output signal of the debug enable register.

4. A semiconductor circuit having a security releasing means comparing first data with second data and turning on a switch when the two data agree, said semiconductor circuit comprising:
   a memory device to store a control program and data, the data stored in the memory device including said first data;
   a central processing unit to execute a specific process according to the program;
   a non-volatile register that stores said second data, said second data including a security bit;
   a test port to input and output test signals, including said first data; and
   a unit to control on/off between the test port and at least one of the memory device and the central processing unit according to the security bit set in the nonvolatile register, the unit comprising said switch,
   wherein the security releasing means comprises:
      an address register keeping address information input from the test port and specifying a memory range of the memory device;
      a data register keeping data information input from the test port;
      a comparator comparing data read out from the memory device based on the address information with the data kept in the data register; and
      a logic gate turning on the switch when the two data agree, independent of the state of security bit.

5. A semiconductor circuit having a security releasing means comparing first data with second data and turning on a switch when the two data agree, said semiconductor circuit comprising:
   a memory device to store a control program and data, the data stored in the memory device including said first data;
   a central processing unit to execute a specific process according to the program;
   a non-volatile register that stores said second data, said second data including a security bit;
   a test port to input and output test signals, including said first data; and
   a unit to control on/off between the test port and at least one of the memory device and the central processing unit according to the security bit set in the nonvolatile register, the unit comprising said switch,
   wherein the security releasing means comprises:
      an address counter counting timing information input from the test port sequentially and specifying a memory range;
      a data register keeping data information input from the test port;
      a comparator comparing data read out from the memory device based on the specification of the address counter with the data kept in the data register;
      an agreement number counter outputting a releasing signal when the number of agreement of the data comes to the specific value; and
      a logic gate turning on the switch when the releasing signal is output, independent of the state of security bit.

6. A semiconductor circuit according to claim 5, further comprising an address register setting an initial value based on address information input from the test port.

7. A semiconductor circuit comprising:
   a memory device to store a control program, data, and a security bit;
   a central processing unit to execute a specific process according to the program;
   a test port to input and output test signals;
   a switch to control on/off between the test port and the central processing unit; and
   a security control means for selectively turning off the switch if the security bit has been changed to a predetermined state and for comparing data input via the test port with the data stored in the memory device and turning on the switch when the two data agree,
   wherein the security control means comprises a gate having an output terminal that is connected to the switch and having a plurality of input terminals, one of the input terminals receiving the security bit.

8. A semiconductor circuit having a security releasing means comparing first data with second data and turning on a switch when the two data agree, said semiconductor circuit comprising:
   a memory device to store a control program and data, the data stored in the memory device including said first data;
   a central processing unit to execute a specific process according to the program;
   a non-volatile register that stores said second data, said second data including a security bit;
   a test port to input and output test signals, including said first data; and
   a unit to control on/off between the test port and at least one of the memory device and the central processing unit according to the security bit set in the nonvolatile register, the unit comprising said switch,
   wherein the security releasing means comprises a gate having an output terminal that is connected to the switch and having a plurality of input terminals, one of the input terminals receiving the security bit.

* * * * *